(12) United States Patent
Chen et al.

(10) Patent No.: US 9,029,965 B2
(45) Date of Patent: May 12, 2015

(54) METHOD AND SYSTEM FOR PROVIDING MAGNETIC JUNCTIONS HAVING A THERMALLY STABLE AND EASY TO SWITCH MAGNETIC FREE LAYER

(71) Applicant: Samsung Electronics Co., Ltd., Gyeonggi-do (KR)

(72) Inventors: Eugene Chen, Fremont, CA (US); Dmytro Apalkov, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 70 days.

(21) Appl. No.: 14/026,386

(22) Filed: Sep. 13, 2013

(65) Prior Publication Data

US 2014/0151831 A1   Jun. 5, 2014

Related U.S. Application Data

(63) Continuation-in-part of application No. 13/691,873, filed on Dec. 3, 2012, now Pat. No. 8,890,267.

(51) Int. Cl.
| | |
|---|---|
| *H01L 27/22* | (2006.01) |
| *H01L 43/08* | (2006.01) |
| *G11C 11/16* | (2006.01) |
| *H01L 43/12* | (2006.01) |

(52) U.S. Cl.
CPC ............... *H01L 43/08* (2013.01); *H01L 43/12* (2013.01)

(58) Field of Classification Search
CPC ..... H01L 27/222; H01L 27/224; H01L 43/08; H01L 29/82; G11C 11/15; G11C 11/16; G11C 11/161

USPC ........... 257/421, E43.004, E29.323, E27.005, 257/E27.006; 365/158, 171–173
See application file for complete search history.

(56) References Cited

U.S. PATENT DOCUMENTS

| | | | |
|---|---|---|---|
| 6,807,034 B2 | 10/2004 | Hasegawa et al. | |
| 7,242,045 B2 | 7/2007 | Nguyen et al. | |
| 7,378,698 B2 | 5/2008 | Ha et al. | |
| 7,595,966 B2 | 9/2009 | Watanabe et al. | |
| 7,800,942 B2 * | 9/2010 | Chen et al. ................... | 365/173 |
| 7,869,266 B2 * | 1/2011 | Ranjan et al. ................. | 365/158 |
| 7,907,440 B2 | 3/2011 | Worledge | |
| 7,985,994 B2 | 7/2011 | Zheng et al. | |

(Continued)

FOREIGN PATENT DOCUMENTS

| | | |
|---|---|---|
| JP | 2002151758 | 5/2002 |
| JP | 2011060918 | 3/2011 |

*Primary Examiner* — Allison P Bernstein
(74) *Attorney, Agent, or Firm* — Convergent Law Group LLP

(57) ABSTRACT

A method and system provide a magnetic junction usable in a magnetic device. The magnetic junction includes a pinned layer, a nonmagnetic spacer layer, and a free layer. The nonmagnetic spacer layer is between the pinned layer and the free layer. The free layer includes a plurality of subregions. Each of the subregions has a magnetic thermal stability constant. The subregions are ferromagnetically coupled such that the free layer has a total magnetic thermal stability constant. The magnetic thermal stability constant is such that the each of the subregions is magnetically thermally unstable at an operating temperature. The total magnetic thermal stability constant is such that the free layer is magnetically thermally stable at the operating temperature. The magnetic junction is configured such that the free layer is switchable between a plurality of stable magnetic states when a write current is passed through the magnetic junction.

20 Claims, 8 Drawing Sheets

(56) References Cited

U.S. PATENT DOCUMENTS

| | | | |
|---|---|---|---|
| 8,063,459 B2* | 11/2011 | Ranjan et al. | 257/421 |
| 8,183,652 B2* | 5/2012 | Ranjan et al. | 257/421 |
| 2007/0096229 A1* | 5/2007 | Yoshikawa et al. | 257/421 |
| 2010/0277976 A1 | 11/2010 | Oh et al. | |
| 2011/0031569 A1 | 2/2011 | Watts et al. | |
| 2011/0141803 A1 | 6/2011 | Kim et al. | |
| 2012/0018823 A1 | 1/2012 | Huai et al. | |
| 2012/0063218 A1* | 3/2012 | Huai et al. | 365/171 |

\* cited by examiner

METHOD AND SYSTEM FOR PROVIDING MAGNETIC JUNCTIONS HAVING A THERMALLY STABLE AND EASY TO SWITCH MAGNETIC FREE LAYER

CROSS-REFERENCE TO RELATED APPLICATIONS

This application is a Continuation-In-Part of U.S. patent application Ser. No. 13/691,873, filed Dec. 3, 2012 and is incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the magnetization of AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined, Although the conventional MTJ 10 may be written using spin transfer, read by sensing the TMR of the junction, and used in an STT-MRAM, there are drawbacks. For example, the critical switching current density, $J_{c0}$, of the conventional free layer 20 may be significantly higher than desired. In some cases, the critical switching current density is on the order of three to five times higher than the desired critical switching current density. The critical switching current density is the current density (e.g. $MA/cm^2$) required to switch the magnetic moment 21 of the conventional free layer 20 using spin transfer. A low switching current is desired, for example, to reduce the power consumed during switching and/or to improve the switching speed or error rates. Although conventional mechanisms exist that reduce the switching current, these generally adversely affect thermal stability. A reduction in the thermal stability of the conventional MTJ 10 negatively impacts the ability of the conventional MTJ 10 to reliably store data over time. Thus, performance of the conventional MTJ suffers.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a pinned layer, a nonmagnetic spacer layer, and a free layer. The nonmagnetic spacer layer is between the pinned layer and the free layer. The free layer includes a plurality of subregions. Each of the subregions has a magnetic thermal stability constant. The subregions are ferromagnetically coupled such that the free layer has a total magnetic thermal stability constant. The magnetic thermal stability constant is such that the each of the subregions is magnetically thermally unstable at an operating temperature. The total magnetic thermal stability constant is such that the free layer is magnetically thermally stable at the operating temperature. The magnetic junction is configured such that the free layer is switchable between a plurality of stable magnetic states when a write current is passed through the magnetic junction.

DETAILED DESCRIPTION OF THE INVENTION

Figure 1:
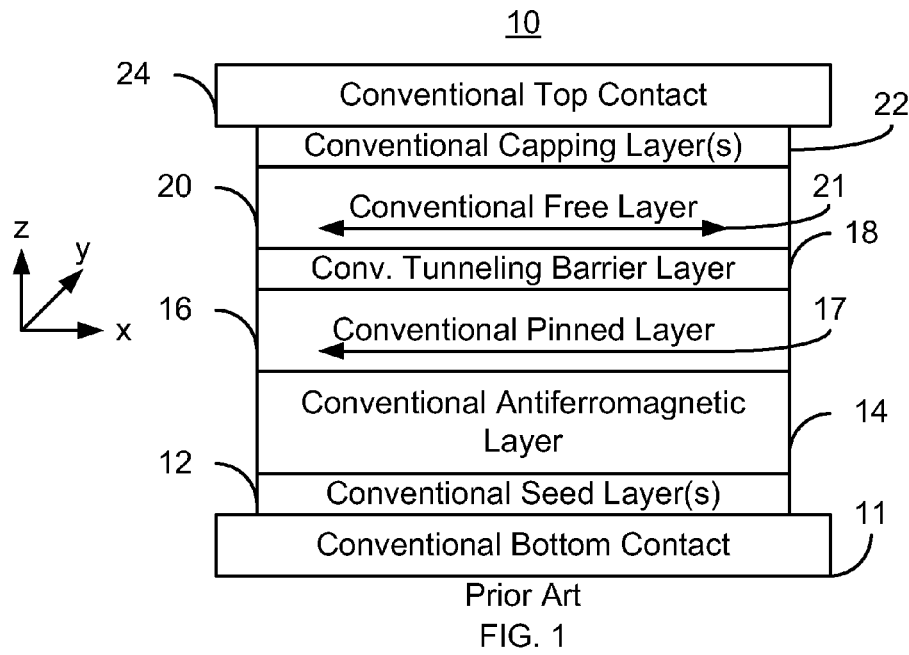
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems provide a magnetic junction as well as a magnetic memory utilizing the magnetic junction. The magnetic junction includes a pinned layer, a nonmagnetic spacer layer, and a free layer. The nonmagnetic spacer layer is between the pinned layer and the free layer. The free layer includes a plurality of subregions. Each of the subregions has a magnetic thermal stability constant. The subregions are ferromagnetically coupled such that the free layer has a total magnetic thermal stability constant. The magnetic thermal stability constant is such that the each of the subregions is magnetically thermally unstable at an operating temperature. The total magnetic thermal stability constant is such that the free layer is magnetically thermally stable at the operating temperature. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or free layers having particular layers. However, one of ordinary skill in the art will readily recognize that magnetic junctions and/or free layers having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and free layers. However, one of ordinary skill in the art will readily recognize that the method and system are consistent with the use of magnetic memories having multiple magnetic junctions and using multiple free layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
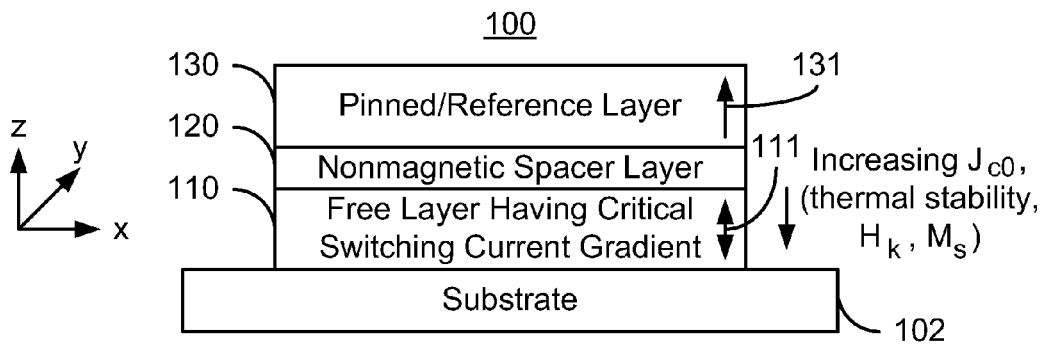
FIG. 2 depicts an exemplary embodiment of a magnetic junction including a free layer having a gradient in the critical switching current density and switchable using spin transfer.

FIG. 2 depicts an exemplary embodiment of a magnetic junction 100 including a free layer having a gradient in the critical switching current density and switchable using spin transfer. The magnetic junction may be, for example a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-MRAM. For clarity, FIG. 2 is not to scale. The magnetic junction includes a free layer 110, a nonmagnetic spacer layer 120 and a pinned or reference layer 130. The magnetic junction 100 is shown as residing on a substrate 102. In some embodiments, the magnetic junction 100 may include seed layer(s) and/or capping layer(s) (not shown). Although layers 110, 120, and 130 are shown with a particular orientation, this orientation may vary in other embodiments. For example, the pinned layer 130 may be closer to the bottom (closest to the substrate 102) of the magnetic junction 100. A pinning layer (not shown) may also be used. In general, the pinning layer would be used if the magnetic moment of the pinned layer 130 is in plane but would not be used if the magnetic moment of the pinned layer 130 is perpendicular to plane, as shown. Such a pinning layer may be used to fix the magnetization 131 of the pinned layer 130. In some embodiments, the pinning layer may be an AFM layer or multilayer that pins the magnetization (not shown) of the pinned layer 130 by an exchange-bias interaction. The magnetic junction 100 is also configured to allow the free layer 110 to be switched between stable magnetic states when a write current is passed through the magnetic junction 100. Thus, the magnetic moment 111 of the free layer 110 is switchable utilizing spin transfer torque. Because the magnetic moment 111 is switchable, the magnetic moment 111 is indicated by a dual headed arrow.

The nonmagnetic spacer layer 120 may be a tunneling barrier layer, conductor, or other structure for which magnetoresistance is exhibited between the free layer 110 and the pinned layer 130. In some embodiments, the nonmagnetic spacer layer 120 is a crystalline MgO tunneling barrier layer. Such a nonmagnetic spacer layer may have a preferred crystallographic orientation, such as a (100) orientation.

Although depicted as simple layers, the free layer 110 and/or the pinned layer 130 may include multiple layers. For example, the free layer 110 and/or the pinned layer 130 may be a SAF including magnetic layers antiferromagnetically or ferromagnetically coupled through thin layers, such as Ru. In such a SAF, multiple magnetic layers interleaved with thin layer(s) of Ru or other material may be used. The free layer 110 and/or the pinned layer 130 may also be another multilayer.

The free layer 110 and/or the pinned layer 130 may each have a perpendicular anisotropy energy that exceeds the out-of-plane demagnetization energy. Thus, the free layer 110 and/or the pinned layer 130 may each have its magnetic moment 111 and/or 131, respectively, oriented perpendicular to plane at equilibrium as is shown in FIG. 2. Stated differently, the easy axes of the layer 110 and 130 are perpendicular to plane. The free layer magnetic moment 111 is switchable using spin transfer and thus is shown by a dual arrow 111. The magnetic moment 131 of the pinned layer 130 may be fixed in a particular direction. In the embodiment shown, the magnetic moment 131 of the pinned layer 130 is in the positive z-direction. In another embodiment, the magnetic moment 131 may be in the negative z direction. In other embodiments, the magnetic moment of the free layer 110 and/or the pinned layer 130 may be stable in another direction including but not limited to in-plane. Other orientations of the magnetic moments of the free layer 110 and/or the pinned layer 130 are possible.

The free layer 110 has a gradient in the critical switching current density, $J_{c0}$. More specifically, the critical switching current density is lower closer to the nonmagnetic spacer layer 120. Thus, a first $J_{c0}$ of a first portion of the free layer 110 is lower than a second $J_{c0}$ of a second portion of the free layer 110 if the second portion is further from the nonmagnetic spacer layer than the first portion. As the free layer 110 is traversed in a direction away from the nonmagnetic spacer layer 120 (i.e. in the negative z direction in FIG. 2), $J_{c0}$ increases. In some embodiments $J_{c0}$ increases monotonically. The change may be linear or may follow another curve. In some embodiments, $J_{c0}$ may remain constant for a particular portion of the free layer 110. However, $J_{c0}$ is not constant over the entire free layer 110. In some embodiments, there is also a gradient in the thermal stability of the free layer 110. Like $J_{c0}$, the thermal stability may also increase further from the nonmagnetic spacer layer 120'. In some embodiments, the thermal stability increases in the same manner as the $J_{c0}$. However, in other embodiments, the thermal stability may vary in another manner.

The gradient in $J_{c0}$ within the free layer 110 may be achieved in a number of ways. For example, the $J_{c0}$ varies with the magnetic anisotropy, $H_k$, and the saturation magnetization, $M_s$. In some embodiments, the magnetic anisotropy, such as the perpendicular magnetic anisotropy, may increase with increasing distance from the nonmagnetic spacer layer 120. In other embodiments, the saturation magnetization may increase with increasing distance from the nonmagnetic spacer layer 120. In still other embodiments, these quantities may increase or decrease through the free layer 110. However, the combination is such that the desired gradient in $J_{c0}$ is established. For example, the magnetic anisotropy may decrease over some portion of the free layer 110 while the saturation magnetization may increase over the same portion. However the combination of these and other parameters are such that the switching current density increases with increasing distance from the nonmagnetic spacer layer.

The variation in $H_k$, $M_s$, and/or other properties that influence the critical switching current density may be achieved in a number of ways. In some embodiments, the free layer 110 may be an alloy having variations in concentrations in magnetic constituents such as Co and/or Fe. This gradient in concentration may be achieved in a number of ways. For example, the magnetic and other materials may be co-sputtered from multiple targets. By varying the sputtering rate from particular targets, the stoichiometry of the alloy may be changed. The gradient may also be achieved via atomic diffusion due to high temperature annealing after the free layer 110 has been deposited. The annealing may take place in situ or ex situ. Some combination of these and other techniques may be used. In other embodiments, the concentration of other materials including but not limited to dopants such as B may be tailored to achieve the desired gradient(s) in magnetic anisotropy and/or saturation magnetization.

In some embodiments, the free layer 110 may be a multilayer, including multiple magnetic layers. In some such embodiments, the magnetic layers may be interleaved with nonmagnetic layers. The nonmagnetic layers may be insulators such as MgO, conductors such as Pt or Pd, or some combination thereof. However, the magnetic layers are ferromagnetically coupled through the nonmagnetic layers. The magnetic layers are configured such that there is a gradient in $J_{c0}$ between the magnetic layers. Thus, a magnetic layer closer to the nonmagnetic spacer layer 120 has a lower $J_{c0}$ than another layer further from the nonmagnetic spacer layer. This gradient in $J_{c0}$ between the magnetic layers may be achieved by one or more of judicious selection of magnetic and/or nonmagnetic materials, variations in thickness of the magnetic layers, varying the thickness of the nonmagnetic layers, and some other analogous mechanism.

The magnetic junction 100 may have improved performance. Because of the gradient in $J_{c0}$, the overall switching current for the free layer 110 may be reduced. In some embodiments, the total critical switching current density may be $1 \times 10^6$ A/cm². The portion of the free layer 110 (e.g. magnetic layers) near the nonmagnetic spacer layer 120 may be easily switchable by itself. In some embodiments, this portion of the free layer 110 is not thermally stable. The next magnetic portion of the free layer 110 may have a higher switching current and be more thermally stable. The portion of the free layer 110 furthest from the nonmagnetic spacer layer 120 may be the most thermally stable and may have the highest $J_{c0}$. Because magnetic portions of the free layer 110 further from the nonmagnetic spacer layer 120 are thermally stable and ferromagnetically coupled with portions of the free layer 110 closer to the nonmagnetic spacer layer 120, the free layer 110 is thermally stable as a whole. Because magnetic portions of the free layer 110 closer to the nonmagnetic spacer layer 120 have a lower $J_{c0}$ and are ferromagnetically coupled with other portions of the free layer 110, the free layer as a whole switches at a lower $J_{c0}$. Thus, thermal stability and lower $J_{c0}$ may be achieved. Thus, the performance of the magnetic junction 100 may improve.

Although the magnetic junction 100 functions well for its intended purpose, further improvements in the write error rate (WER), switching time and switching current may be desired. The WER is the probability that a cell (i.e. the magnetization 111 of free layer 110 of the magnetic junction) is not switched when subjected to a current that is at least equal to the typical switching current. The WER is desired to be $10^{-9}$ or less. The WER may be improved by overdriving the magnetic junction, which uses a write current in excess of the switching current. However, it has also been determined that the WER may be challenging to improve for shorter write current pulses. Stated differently, number of magnetic junctions switched using spin transfer based switching versus current magnitude and current pulse length may have a long tail. The desired WER may thus require overdrive and longer pulse length. Consequently, memories employing the conventional MTJ 10 may have unacceptably high WER that may not be cured by overdriving the MTJ for shorter pulse lengths.

Further, the free layer is desired to be magnetically thermally stable. Thermal stability may be determined by the magnetic thermal stability constant, $\Delta$, for the free layer 110. The magnetic thermal stability constant divided by the product of Boltzmann's constant and the operating temperature ($k_bT$) is generally desired to be in excess of eighty (i.e. $\Delta/k_bT > 80$) for the magnetic moment of the free layer to be stable. Thus, a larger $\Delta$ is desired for thermal stability. The switching current is, however, proportional to $\Delta$. Thus, a higher $\Delta$ corresponds to a higher switching current. In essence, the higher $\Delta$ corresponds to overdriving the magnetic junction to a greater extent in order to achieve the desired WER. This is undesirable. Damping and other mechanisms may act to reduce the switching current. However, the magnetic thermal stability constant may still limit the extent to which the switching current may be reduced.

Figure 3:
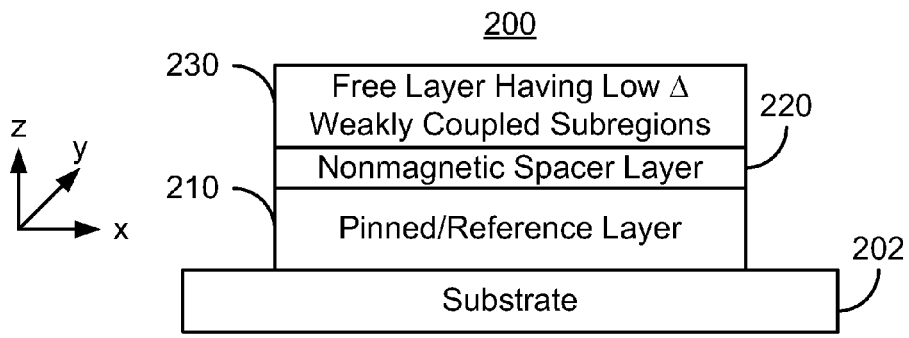
FIG. 3 depicts an exemplary embodiment of a magnetic junction including a free layer having a low magnetic thermal stability, ferromagnetic coupling and switchable using spin transfer.

FIG. 3 depicts an exemplary embodiment of a magnetic junction 200 including a free layer having subregions with a low magnetic thermal stability constant as well as magnetic coupling between the subregions. The free layer is also switchable using spin transfer. The magnetic junction may be, for example a MTJ, spin valve, or ballistic magnetoresistance structure, or some combination thereof. The magnetic junction 200 may be used in a variety of applications. For example, the magnetic junction may be used in a magnetic memory such as an STT-MRAM. The memory may be used in a variety of devices including but not limited to cell phones or other systems that may use nonvolatile memory. For clarity, FIG. 3 is not to scale.

The magnetic junction includes a pinned or reference layer 210, a nonmagnetic spacer layer 220 and a free layer 230. The magnetic junction 200 is shown as residing on a substrate 202. In some embodiments, the magnetic junction 200 may include seed layer(s) and/or capping layer(s) (not shown). Although layers 210, 220, and 230 are shown with a particular orientation, this orientation may vary in other embodiments. For example, the pinned layer 210 is shown as closer to the bottom (closest to the substrate 202) for the magnetic junction 200. A pinning layer (not shown) may also be used. In general, the pinning layer would be used if the magnetic moment of the pinned layer 210 is in plane but would not be used if the magnetic moment of the pinned layer 210 is perpendicular to plane, as shown. Such a pinning layer may be used to fix the magnetization (not shown) of the pinned layer 210. In some embodiments, the pinning layer may be an AFM layer or multilayer that pins the magnetization (not shown) of the pinned layer 210 by an exchange-bias interaction. The magnetic junction 200 is also configured to allow the free layer 230 to be switched between stable magnetic states when a write current is passed through the magnetic junction 200. Thus, the magnetic moment (not explicitly shown in FIG. 3) of the free layer 230 is switchable utilizing spin transfer torque.

The nonmagnetic spacer layer 220 may be a tunneling barrier layer, conductor, or other structure for which magnetoresistance is exhibited between the free layer 230 and the pinned layer 210. In some embodiments, the nonmagnetic spacer layer 220 is a crystalline MgO tunneling barrier layer. Such a nonmagnetic spacer layer may have a preferred crystallographic orientation, such as a (100) orientation. However, in additional and/or other embodiments, other material(s) may be used.

Although depicted as simple layers, the pinned layer 210 and/or the free layer 230 may include multiple layers. For example, the pinned layer 210 may be a SAF including magnetic layers antiferromagnetically or ferromagnetically coupled through thin layers, such as Ru. In such a SAF, multiple magnetic layers interleaved with thin layer(s) of Ru or other material may be used. The free layer 230 and/or the pinned layer 210 may also be another multilayer.

The free layer 230 and/or the pinned layer 210 may each have a perpendicular anisotropy energy that exceeds the out-of-plane demagnetization energy. Thus, the free layer 230 and/or the pinned layer 210 may each have its magnetic moment oriented perpendicular to plane at equilibrium. Stated differently, the easy axis of the layer 210 and/or 230 may be perpendicular to plane. In other embodiments, the magnetic moment of the free layer 230 and/or the pinned layer 210 may be stable in another direction including but not limited to in-plane. Other orientations of the magnetic moments of the free layer 230 and/or the pinned layer 210 are possible.

The free layer 230 has a number of subregions therein. In some embodiments, the subregions may correspond to ferromagnetic layers within the free layer 230. In other embodiments, the subregions may be grains or other ferromagnetic regions within a single layer. In still other embodiments, both types of subregions may be combined. Each subregion has a thermal stability factor, $\Delta/k_bT$, where $k_b$ is Boltzmann's constant, T is the temperature in Kelvin and $\Delta$ is the magnetic thermal stability constant for the subregion. The thermal stability factor ($\Delta/k_bT$) for each of the subregions may be low in the range of operating temperatures. Stated differently, the magnetic thermal stability constant, $\Delta$, may be low. The thermal stability factor/low magnetic thermal stability constant may be sufficiently low that an individual subregion would be thermally unstable at operating temperature. For example, individual subregions may be thermally unstable at room temperature. In some embodiments, this corresponds to $\Delta/k_bT$ being less than sixty at operating temperatures. In some embodiments, $\Delta/k_bT$ may be less than forty at operating temperatures. Thus, in the absence of other subregions, individual subregions in the free layer 230 may be thermally unstable at room temperature.

Although the subregions may be thermally unstable as individuals, the free layer 230 as a whole may be thermally stable. The subregions are weakly magnetically coupled. In some embodiments, the subregions are ferromagnetically coupled. Because of this weak ferromagnetic coupling, the magnetic moments of the subregions of the free layer 230 tend to align generally in the same direction and stay aligned in the same general direction. As a result, the free layer 230 in its entirety is thermally stable at room temperature. This may be considered to correspond to $\Delta_{total}/k_bT$ being at least sixty. In some embodiments, the free layer may have a thermal stability factor, $\Delta_{total}/k_bT$, of at least eighty. This is because the magnetic coupling between the subregions may be part of $\Delta_{total}$, but not part of $\Delta$ for individual subregions when write currents are applied.

The ferromagnetic coupling between two subregions may be determined as follows. A dimensionless coupling parameter, Ac, is defined for each subregion. This dimensionless coupling parameter is given by:

$$Ac = \text{coupling energy}/(\Delta * k_b * T * Z),$$

where "coupling energy" is the total energy of coupling between two subregions, $\Delta$ is the thermal stability of the subregion itself, and Z is the number of adjoining subregions for each subregion. The term $\Delta$ is significantly less than sixty because, as discussed above, each subregion is not thermally stable on its own. Z is typically at least four and not more than six and may also be termed the coordination number for the subregion. Ac is desired to be at least 0.2 and not more than 3.0. In some embodiments, Ac is at least 0.5 and not more than 1.2.

Thus, the free layer 230 is thermally stable when not being written. In addition, the free layer 230 is stable when read. For example, the magnetic moment of the free layer 230 may be stable for a read current of up to one-third of the write current. In some embodiments, the magnetic moment of the free layer 230 may be stable for a read current of up to not more than one-half of the write current. Such a read current may, therefore, be insufficient to overcome the magnetic interaction between the subregions. However, the magnetic moment of the free layer 230 may be switched using a write current. In alternate embodiments, the magnetic moment of the free layer 230 may be switched using a combination of a write current and a magnetic field.

For a read operation, a read current is driven through the magnetic junction 200. Based on the resistance of the magnetic junction 200, the state of the free layer 230 may be determined. For a write operation, the write current in the desired direction may be applied in lieu of or in addition to a magnetic field. The spin transfer induced torque due to the write current may thus be sufficient overcome the magnetic coupling between the subregions. Once the weak magnetic coupling has been overcome, the individual subregions may also be readily switched using the spin transfer torque. This is because the subregions have a low thermal stability factor/low thermal stability constant. For example, the magnetic moments of one or more of the individual subregions may not be aligned with the net magnetic moment of the free layer 230 and/or have a lower write current. As a result, the spin transfer torque may more readily switch the magnetic moment of the free layer 230. Thus, the subregions of the free layer 230 may switch at different currents and/or times in a manner analogous to the layers of the free layer 110. However, the order in which the subregions of the free layer 230 switch is not constrained in the same manner as the layers of the free layer 110. For example, if the subregions of the free layer 230 are layers, they need not have a switching current density/thermal stability that increases in a direction away from the nonmagnetic spacer layer 220. The subregions of the free layer 230 may switch in a random order, or in an order that excludes switching in order from subregion closest to the nonmagnetic spacer layer 220 to furthest from the nonmagnetic spacer layer 220.

The magnetic junction 200 may have improved performance. Because of the magnetic coupling, the free layer 230 is thermally stable at and below the working temperatures. Because of the lower magnetic thermal stability constant and lower magnetic thermal stability factor for the subregions, the required write current may be reduced. Further, individual subregions may be more easily switched. Because it depends upon $\Delta$, the WER may also be reduced for individual subregions, including for reduced pulse lengths. For similar reasons, the subregions may be switched without or with reduced overdrive. Thus, faster, less error prone switching may be achieved.

Figure 4:
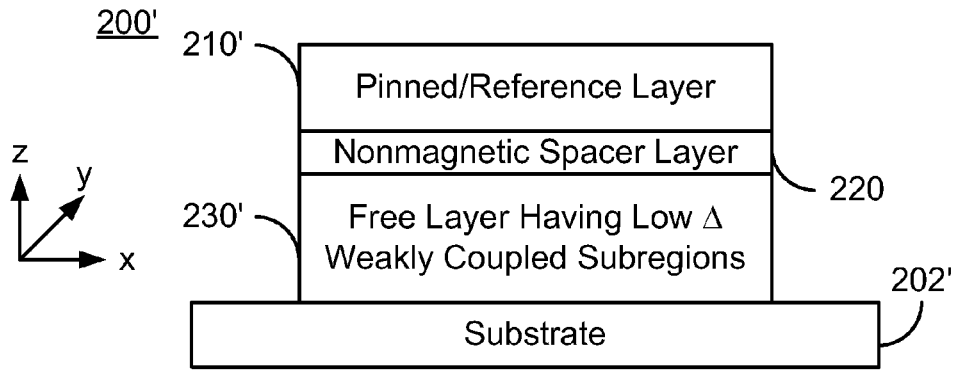
FIG. 4 depicts another exemplary embodiment of a magnetic junction including a free layer having a low magnetic thermal stability, ferromagnetic coupling and switchable using spin transfer.

FIG. 4 depicts another exemplary embodiment of a magnetic junction 200' including a free layer 230' having subregions with a low magnetic thermal stability constant as well as magnetic coupling between the subregions and switchable using spin transfer. For clarity, FIG. 4 is not to scale. The magnetic junction 200' is analogous to the magnetic junction 200. Thus, analogous layers are labeled similarly. The magnetic junction 200' includes a pinned layer 210', a nonmagnetic spacer layer 220, and a free layer 230' analogous to the layers 210, 220, and 230, respectively. In some embodiments, an optional seed layer (not shown), an optional pinning layer (not shown) and/or optional capping layer (not shown) may be included. The magnetic junction 200' is also configured to allow the magnetization of the free layer 230' to be switched between stable magnetic states when a write current is passed through the magnetic junction 200'. Thus, the magnetization of the free layer 230' is switchable utilizing spin transfer torque.

In the magnetic junction 200', the free layer 230' is closer to the substrate 202' than the pinned layer 210'. The free layer 230' has subregions that are analogous to those in the free layer 230. In some embodiments, the subregions may correspond to ferromagnetic layers within the free layer 230'. In other embodiments, the subregions may be grains or other ferromagnetic regions within a single layer. In still other embodiments, both types of subregions may be combined. Thus, the thermal stability factor and magnetic thermal stability constant may be low. In some embodiments, the thermal stability factor/low magnetic thermal stability constant may be sufficiently low that an individual subregion would be thermally unstable at operating temperature. In some embodiments, this corresponds to $\Delta/k_bT$ being less than sixty at operating temperatures. In some embodiments, $\Delta/k_bT$ may be less than forty at operating temperatures.

Although the subregions may be thermally unstable as individuals, the free layer 230' as a whole may be thermally stable, in an analogous manner to the free layer 230. The subregions are weakly magnetically coupled. In some embodiments, the subregions are ferromagnetically coupled. Because of this weak ferromagnetic coupling, the magnetic moments of the subregions of the free layer 230' tend to align generally in the same direction and stay aligned in the same general direction. As a result, the free layer 230' in its entirety is thermally stable at room temperature.

The magnetic junction 200' may share the benefits of the magnetic junction 200. Because of the low thermal stability factor for individual subregions and magnetic coupling between subregions the magnetic junction 200' may have improved performance. Because of the magnetic coupling, the free layer 230' is thermally stable at and below the working temperatures. Because of the lower magnetic thermal stability constant and lower magnetic thermal stability factor for the subregions, the required write current, WER and overdrive may be reduced and faster writing achieved. Thus, faster, less error prone switching may be achieved.

Figure 5:
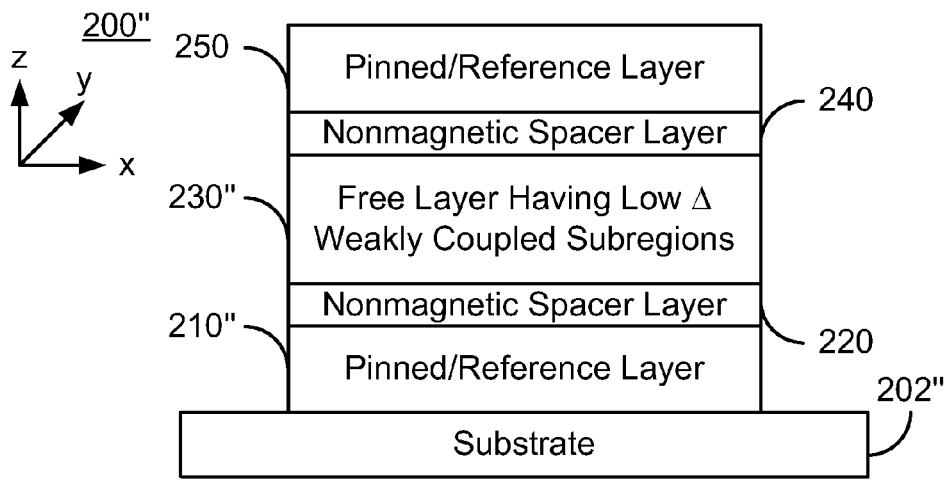
FIG. 5 depicts another exemplary embodiment of a magnetic junction including a free layer having a low magnetic thermal stability, ferromagnetic coupling and switchable using spin transfer.

FIG. 5 depicts another exemplary embodiment of a magnetic junction 200'' including a free layer 230'' having subregions with a low magnetic thermal stability constant as well as magnetic coupling between the subregions and switchable using spin transfer. For clarity, FIG. 5 is not to scale. The magnetic junction 200'' is analogous to the magnetic junction 200/200'. Thus, analogous layers are labeled similarly. The magnetic junction 200'' includes a pinned layer 210'', a nonmagnetic spacer layer 220, and a free layer 230'' analogous to the layers 210/210', 220, and 230/230', respectively. In some embodiments, an optional seed layer (not shown), an optional pinning layer (not shown) and/or optional capping layer (not shown) may be included. The magnetic junction 200'' is also configured to allow the magnetization of the free layer 230'' to be switched between stable magnetic states when a write current is passed through the magnetic junction 200''. Thus, the magnetization of the free layer 230'' is switchable utilizing spin transfer torque.

The magnetic junction 200'' is a dual magnetic junction. Thus, the free layer 230'' resides between two nonmagnetic spacer layers 220 and 240. The magnetic junction 200'' also includes an additional pinned layer 250 analogous to the pinned layer 210/210'/210''. The free layer 230'' has subregions that are analogous to those in the free layers 230 and/or 230'. In some embodiments, the subregions may correspond to ferromagnetic layers within the free layer 230''. In other embodiments, the subregions may be grains or other ferromagnetic regions within a single layer. In still other embodiments, both types of subregions may be combined. Thus, the thermal stability factor and magnetic thermal stability constant may be low. In some embodiments, the thermal stability factor/low magnetic thermal stability constant may be sufficiently low that an individual subregion would be thermally unstable at operating temperature. In some embodiments, this corresponds to $\Delta/k_bT$ being less than sixty at operating temperatures. In some embodiments, $\Delta/k_bT$ may be less than forty at operating temperatures.

Although the subregions may be thermally unstable as individuals, the free layer 230'' as a whole may be thermally stable, in an analogous manner to the free layers 230 and/or 230'. The subregions are weakly magnetically coupled. In some embodiments, the subregions are ferromagnetically coupled. Because of this weak ferromagnetic coupling, the magnetic moments of the subregions of the free layer 230'' tend to align generally in the same direction and stay aligned in the same general direction. As a result, the free layer 230'' in its entirety is thermally stable at room temperature.

The magnetic junction 200'' may share the benefits of the magnetic junctions 200 and/or 200'. Because of the low thermal stability factor for individual subregions and magnetic coupling between subregions the magnetic junction 200'' may have improved performance. Because of the magnetic coupling, the free layer 230'' is thermally stable at and below the working temperatures. Because of the lower magnetic thermal stability constant and lower magnetic thermal stability factor for the subregions, the required write current, WER and overdrive may be reduced and faster writing achieved. Thus, faster, less error prone switching may be achieved.

Figure 6:
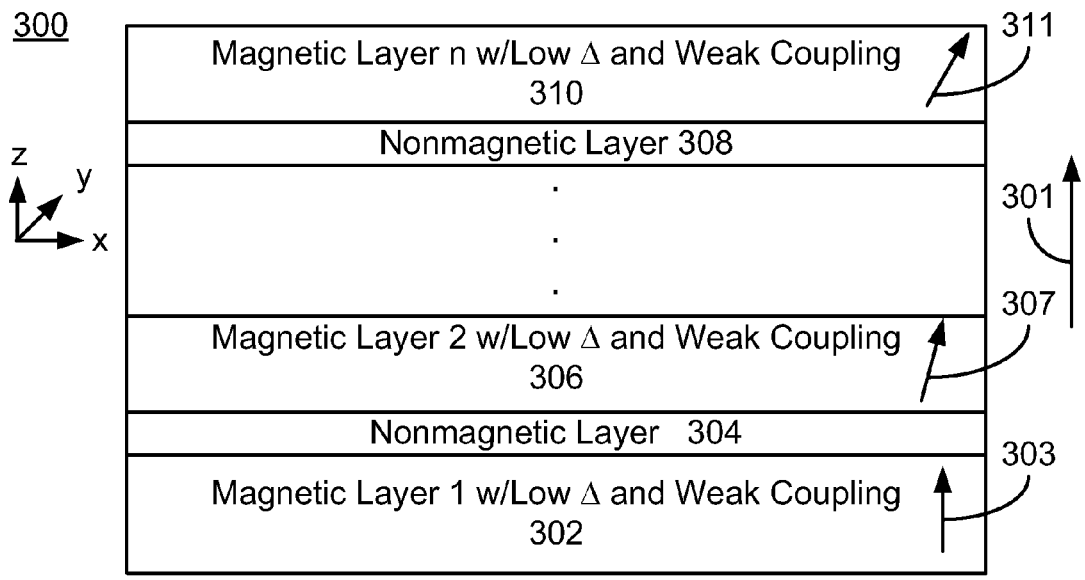
FIG. 6 depicts an exemplary embodiment of a free layer having a low magnetic thermal stability, ferromagnetic coupling and switchable using spin transfer.

FIG. 6 depicts another exemplary embodiment of a free layer 300 having subregions with a low magnetic thermal stability constant as well as magnetic coupling between the subregions and that are switchable using spin transfer. For clarity, FIG. 6 is not to scale. The free layer 300 may be usable in one or more of the magnetic junctions 200, 200' and/or 200''. Thus, the free layer 300 may be used as one or more of the free layers 230, 230' and 230''.

The free layer 300 includes magnetic layers 302, 306 and 310 interleaved with nonmagnetic layers 304 and 308. The magnetic layers 302, 306 and 310 correspond to the subregions of the layers 230, 230' and/or 230''. Although three magnetic layers 302, 306 and 310 and two nonmagnetic layers 304 and 308 are shown, another number may be used. For example, two or more magnetic layers may be present in different embodiments. The magnetic layers 302, 306 and 310 have magnetic moments 303, 307 and 311, respectively. In the embodiment shown, the total magnetic moment 301 of the free layer 300 may be substantially perpendicular to plane (i.e. in the z-direction in FIG. 6). Although depicted as being substantially perpendicular to plane, in other embodiments, the magnetic moments 301, 303, 307 and 311 may be in other directions.

In some embodiments, the magnetic layers 302, 306 and 310 each have a low magnetic thermal stability constant and a low thermal factor. In particular, a low thermal stability factor corresponds to a thermal stability factor of less than sixty at operating temperature(s) in some embodiments and/or less then forty at operating temperature(s) in other embodiments. There is also a weak magnetic coupling between the layers 302, 306 and 310. The weak magnetic coupling may be provided through the nonmagnetic layers 304 and 308. The presence of the nonmagnetic layers 304 and 308 allow the magnetic moments 303, 307 and 311 of the magnetic layers 302, 306 and 310, respectively, to differ somewhat. Thus, although individual magnetic layers 302, 306 and 310 may not be thermally stable, the free layer 300 may have a stable net magnetic moment 301 in a particular direction. Because they are magnetic, the magnetic layers 302, 306 and 310 may include at least one of Co, Fe and Ni. In addition, the magnetic layers 302, 306 and 310 may include at least one of B, Ta, W, Ge, V and Si, for example in an alloy with the magnetic materials. The nonmagnetic layers 304 and 308 may include one or more of Ta, W, Nb, Mo, Ru, V, Zr, Hf, Al, Si, Cr, Ga, Ge, Mg, Ti; the nitride(s) of one or more of these metals; the oxide(s) of one or more of these metals; the boride(s) of one or more of these metals; the carbide(s) of one or more of these metals; and/or similar materials.

The magnetic layers 302, 306 and through 310 are configured such that the magnetic moments 303, 307 and 311 are not aligned. In particular, the magnetic moments 303, 307 and 311 may be at different angles with respect to the normal to the plane of the layers. For example, the perpendicular anisotropy, thickness, materials, magnetic moment and/or other magnetic characteristics of the layers 302, 306 and 310 may be individually tailored such that they form different angles with the net perpendicular moment 301. Similarly, the thickness and/or other characteristics of nonmagnetic layers 304 and 308 may be configured such that the magnetic layers 302, 306 and 310 have the desired magnetic moment (magnitude and direction) as well as the desired interaction. For example, the direction of the magnetic moments may be tailored using perpendicular anisotropies. The perpendicular anisotropy ($K_u$) of one layer may be adjusted around its $2\pi M_s^2$ (out-of-plane demagnetization energy) value. When $K_u$ is more than its $2\pi M_s^2$ value, the magnetization of the layer is along its film normal (perpendicular) direction; when $K_u$ is slightly less than its $2\pi M_s^2$ value, the magnetization of the layer tilts between perpendicular and in-plane directions. By tailoring the perpendicular anisotropies of the layers 302, 306 and 310 near the $2\pi M_s^2$ value for that layer, the desired direction of the magnetic moments may be achieved. Thus, the easy axes of the layers 302, 306 and 310 differ. In some embodiments, the layer closest to the nonmagnetic spacer layer 220 is in the direction of the desired net magnetic moment 301 of the free layer 300. In such embodiments, the magnetoresistance may be enhanced. Thus, in the embodiment shown, the free layer 300 may reside above the nonmagnetic spacer layer in a manner analogous to the layer 230. However the same configuration may be used for other magnetic junctions.

Because the magnetic moments 303, 307 and 311 may form different angles with a direction perpendicular to the layers (e.g. the z direction), the switching characteristics of a magnetic junction using the free layer 300 may be improved. When a write current is applied, at least some of the magnetic moments 307 and 311 are not aligned with the z-direction. Thus, the corresponding layers 306 and 310 may not be along a stagnation point. Thus, the spin transfer torque may more readily switch these layers 306 and 310 than the layer 302. Thus, the layers 302, 306 and through 310 of the free layer 300 may switch at different currents and/or times in a manner analogous to the layers of the free layer 110. However, the order in which the layers 302, 306 and through 310 of the free layer 300 switch is not constrained in the same manner as the layers of the free layer 110. For example, the layers 302, 306 and through 310 of the free layer 300 need not have a switching current density/thermal stability that increases in a direction away from the nonmagnetic spacer layer 220. The layers 302, 306 and through 310 of the free layer 300 may switch in a random order, or in an order that excludes switching in order from subregion closest to the nonmagnetic spacer layer 220 to furthest from the nonmagnetic spacer layer 220.

The WER and long tail in switching the free layer 300 may thus be further reduced. Further, a low thermal stability factor for individual subregions/layers 302, 306 and 310 and weak magnetic coupling between subregions/layers 302, 306 and 310 allow the free layer 300 to be thermally stable at and below the working temperatures while reducing the write current, WER and overdrive. Faster writing achieved. Thus, faster, less error prone switching may be achieved for the free layer 300.

Figure 7:
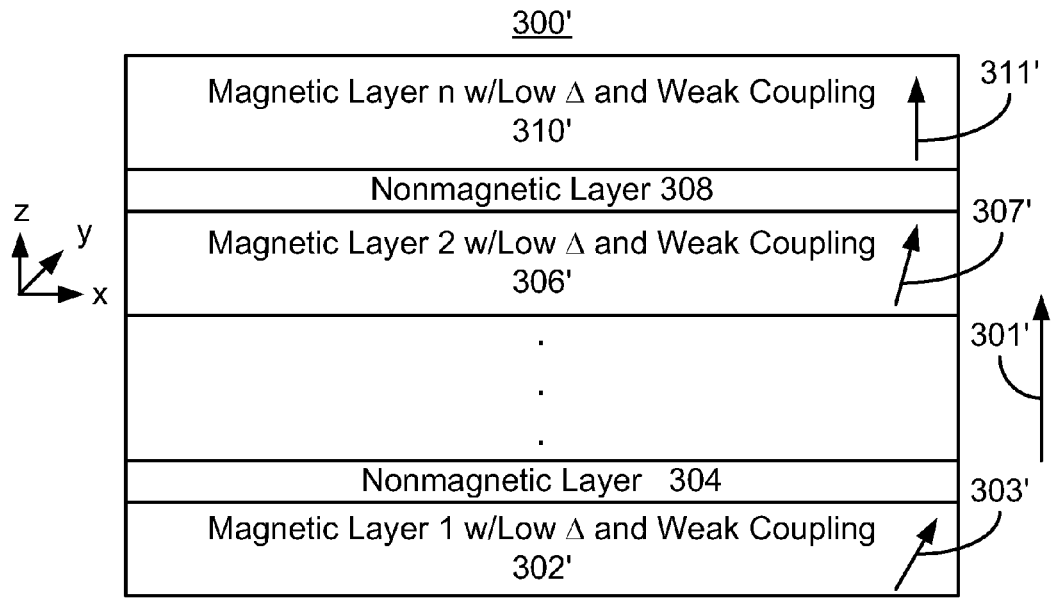
FIG. 7 depicts another exemplary embodiment of a free layer having a low magnetic thermal stability, ferromagnetic coupling and switchable using spin transfer.

FIG. 7 depicts another exemplary embodiment of a free layer 300' having subregions with a low magnetic thermal stability constant as well as magnetic coupling between the subregions and that are switchable using spin transfer. For clarity, FIG. 7 is not to scale. The free layer 300' may be usable in one or more of the magnetic junctions 200, 200' and/or 200". Thus, the free layer 300' may be used as one or more of the free layers 230, 230' and 230".

The free layer 300' is also analogous to the free layer 300. Thus, analogous components have similar labels. The free layer 300' thus includes magnetic layers 302', 306' and 310' interleaved with nonmagnetic layers 304 and 308 and that are analogous to layers 302, 306, 310, 304 and 308, respectively. The magnetic layers 302', 306' and 310' also correspond to the subregions of the layers 230, 230' and/or 230". Although three magnetic layers 302', 306' and 310' and two nonmagnetic layers 304 and 308 are shown, another number may be used. Two or more magnetic layers may be present in different embodiments. The magnetic layers 302', 306' and 310' have magnetic moments 303', 307' and 311' that are analogous to the layers 302, 306 and 310 and magnetic moments 303, 307 and 311, respectively. In the embodiment shown, the total magnetic moment 301' of the free layer 300' may be substantially perpendicular to plane (i.e. in the z-direction). However, the magnetic moments 301', 303', 307' and 311' may be in other directions.

Because they are analogous to the layers 302, 306 and 310, the layers 302', 306' and 310' each may have an analogous low magnetic thermal stability constant, a low thermal stability factor and be weakly magnetically coupled. Thus, although individual magnetic layers 302', 306' and 310' may not be thermally stable, the free layer 300' may have a stable net magnetic moment 301' in a particular direction. The magnetic layers 302', 306' and through 310' are also configured such that the magnetic moments 303', 307' and 311' are not aligned. For example, the perpendicular anisotropy, thickness, materials, magnetic moment and/or other magnetic characteristics of the layers may be individually tailored such that they form different angles with the net perpendicular moment 301'. In some embodiments, the layer closest to the nonmagnetic spacer layer 220 is in the direction of the desired net magnetic moment 301' of the free layer 300'. In such embodiments, the magnetoresistance may be enhanced. Thus, in the embodiment shown, the free layer 300' may reside below the nonmagnetic spacer layer in a manner analogous to the layer 230'. However the same configuration may be used for other magnetic junctions.

The free layer 300' may have similar benefits to the free layer 300. In particular, the WER and write speed may be enhanced by the magnetic moments 303', 307' and 311' forming different angles with a direction perpendicular to the layers (e.g. the z direction). Further, a low thermal stability factor for individual subregions/layers 302', 306' and 310' and weak magnetic coupling between subregions/layers 302', 306' and 310' allow the free layer 300' to be thermally stable at and below the working temperatures while reducing the write current, WER and overdrive. Faster writing achieved. Thus, faster, less error prone switching may be achieved for the free layer 300'.

Figure 8:
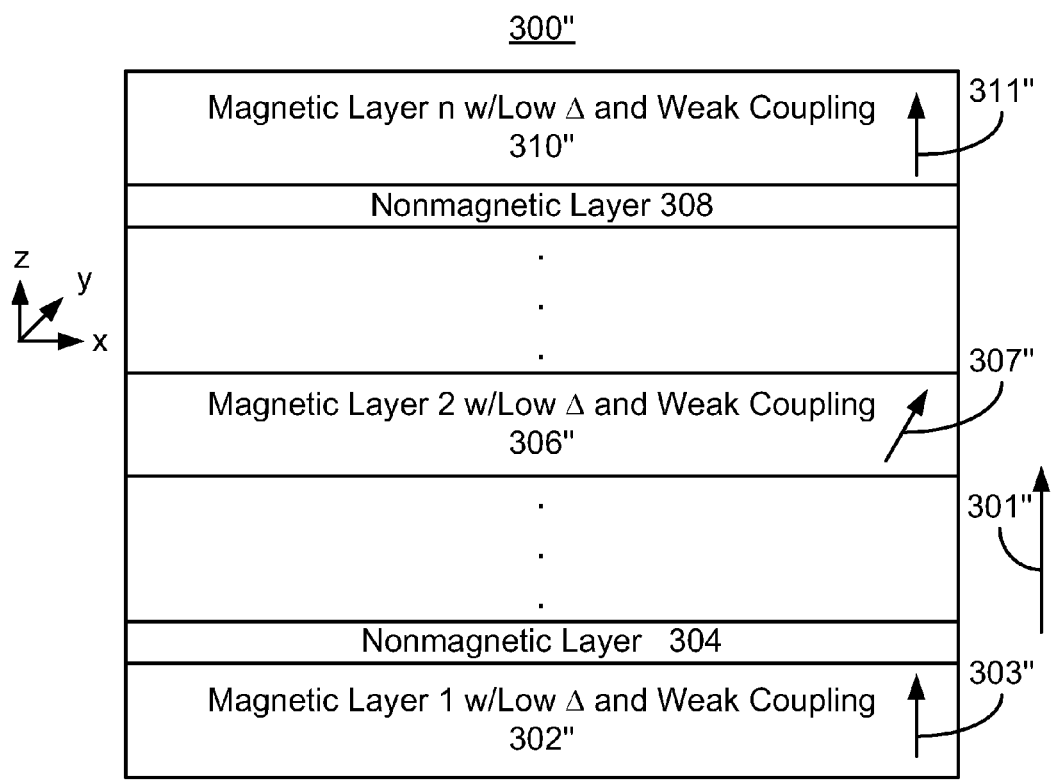
FIG. 8 depicts another exemplary embodiment of a free layer having a low magnetic thermal stability, ferromagnetic coupling and switchable using spin transfer.

FIG. 8 depicts another exemplary embodiment of a free layer 300" having subregions with a low magnetic thermal stability constant as well as magnetic coupling between the subregions and that are switchable using spin transfer. For clarity, FIG. 8 is not to scale. The free layer 300" may be usable in one or more of the magnetic junctions 200, 200' and/or 200". Thus, the free layer 300" may be used as one or more of the free layers 230, 230' and 230".

The free layer 300" is also analogous to the free layers 300 and/or 300'. Thus, analogous components have similar labels. The free layer 300" thus includes magnetic layers 302", 306" and 310" interleaved with nonmagnetic layers 304 and 308 and that are analogous to layers 302/302', 306/306', 310/310', 304 and 308, respectively. The magnetic layers 302", 306" and 310" also correspond to the subregions of the layers 230, 230' and/or 230". Although three magnetic layers 302", 306" and 310" and two nonmagnetic layers 304 and 308 are shown, another number may be used. Two or more magnetic layers may be present in different embodiments. The magnetic moments 303", 307" and 311" are analogous to the magnetic moments 303/303', 307/307' and 311/311', respectively. In the embodiment shown, the total magnetic moment 301" of the free layer 300" may be substantially perpendicular to plane (i.e. in the z-direction). However, the magnetic moments 301", 303", 307" and 311" may be in other directions.

Because they are analogous to the layers 302/302', 306/306' and 310/310', the layers 302", 306" and 310" each may have an analogous low magnetic thermal stability constant, a low thermal stability factor and be weakly magnetically coupled. Thus, although individual magnetic layers 302", 306" and 310" may not be thermally stable, the free layer 300" may have a stable net magnetic moment 301" in a particular direction. The magnetic layers 302", 306" and through 310" are also configured such that the magnetic moments 303", 307" and 311" are not aligned. For example, the perpendicular anisotropy, thickness, materials, magnetic moment and/or other magnetic characteristics of the layers may be individually tailored such that they form different angles with the net perpendicular moment 301". In some embodiments, the layer closest to the nonmagnetic spacer layer 220 is in the direction of the desired net magnetic moment 301" of the free layer 300". In such embodiments, the magnetoresistance may be enhanced. In the embodiment shown, the free layer 300" may be a free layer for a dual magnetic junction in a manner analogous to the layer 230". However the same configuration may be used for other magnetic junctions.

The free layer 300" may have similar benefits to the free layers 300 and/or 300'. In particular, the WER and write speed may be enhanced by the magnetic moments 303", 307" and 311" forming different angles with a direction perpendicular to the layers (e.g. the z direction). Further, a low thermal stability factor for individual subregions/layers 302", 306" and 310" and weak magnetic coupling between subregions/layers 302", 306" and 310" allow the free layer 300" to be thermally stable at and below the working temperatures while reducing the write current, WER and overdrive. Faster writing achieved. Thus, faster, less error prone switching may be achieved for the free layer 300". Further, use of a dual magnetic junction may provide enhanced magnetoresistance and/or enhanced spin transfer torque.

Figure 9:
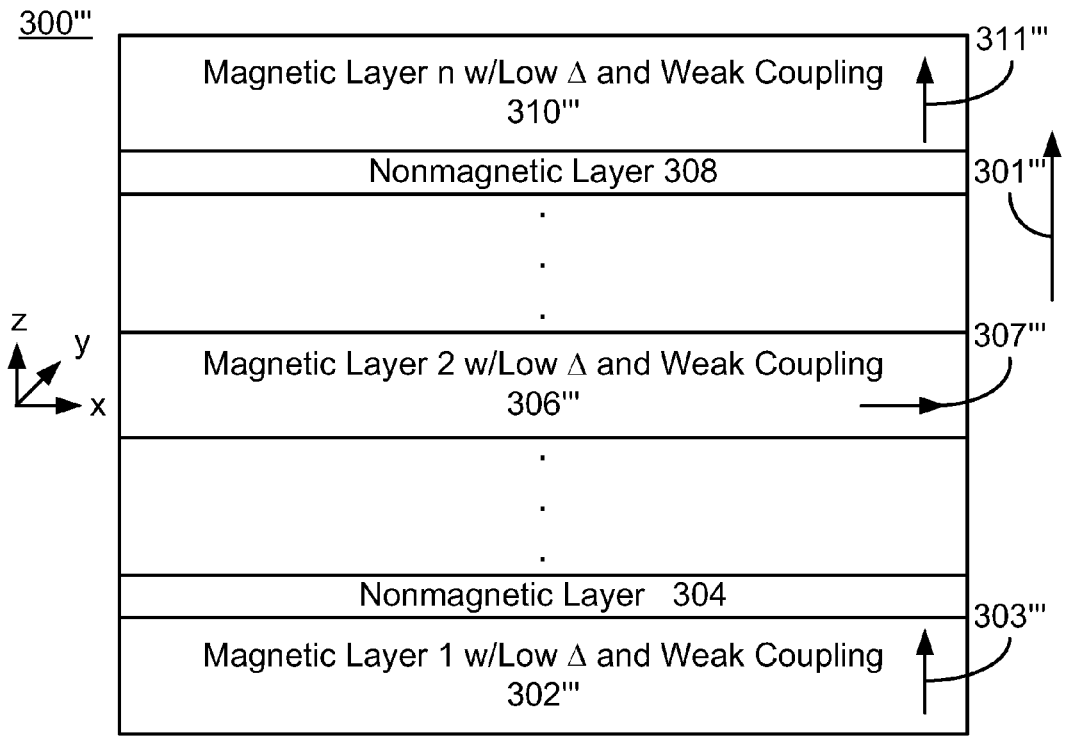
FIG. 9 depicts another exemplary embodiment of a free layer having a low magnetic thermal stability, ferromagnetic coupling and switchable using spin transfer.

FIG. 9 depicts another exemplary embodiment of a free layer 300''' having subregions with a low magnetic thermal stability constant as well as magnetic coupling between the subregions and that are switchable using spin transfer. For clarity, FIG. 9 is not to scale. The free layer 300''' may be usable in one or more of the magnetic junctions 200, 200' and/or 200". Thus, the free layer 300''' may be used as one or more of the free layers 230, 230' and 230". The free layer 300''' is also analogous to the free layers 300, 300' and/or 300". Thus, analogous components have similar labels.

The free layer 300''' thus includes magnetic layers 302''', 306''' and 310''' that are interleaved with nonmagnetic layers 304 and 308, that have magnetic moments 303''', 307''' and 311''' and that are analogous to layers 302/302'/302", 306/306'/306", 310/310'/310", 304 and 308, and to magnetic moments 303/303'/303", 307/307'/307" and 311/311'/311", respectively. The magnetic layers 302''', 306''' and 310''' also correspond to the subregions of the layers 230, 230' and/or 230". Although three magnetic layers 302''', 306''' and 310''' and two nonmagnetic layers 304 and 308 are shown, another number may be used. Two or more magnetic layers may be present in different embodiments. In the embodiment shown, the total magnetic moment 301''' of the free layer 300''' may be substantially perpendicular to plane (i.e. in the z-direction). However, the magnetic moments 301''', 303''', 307''' and 311''' may be in other directions.

In some embodiments, the layer closest to the nonmagnetic spacer layer 220 is in the direction of the desired net magnetic moment 301''' of the free layer 300'''. In such embodiments, the magnetoresistance may be enhanced. Thus, in the embodiment shown, the free layer 300''' may be a free layer for a dual magnetic junction in a manner analogous to the layer 230". However the same configuration may be used for other magnetic junctions. In addition, the magnetic moments closer to the center of the free layer 300''', such as the layer 306''', may have magnetic moments that deviate further from the z-direction. As can be seen in FIG. 9, the layer 306''' has a magnetic moment 307''' that is in plane. However, in other embodiments, the direction of the magnetic moment 307''' may differ.

The free layer 300''' may have similar benefits to the free layers 300, 300' and/or 300". In particular, the WER and write speed may be enhanced by the magnetic moments 303''', 307''' and 311''' forming different angles with a direction perpendicular to the layers (e.g. the z direction). Further, a low thermal stability factor for individual subregions allows the free layer 300''' to be thermally stable at and below the working temperatures while reducing the write current, WER and overdrive. Faster writing achieved. Thus, faster, less error prone switching may be achieved for the free layer 300'''. Further, use of a dual magnetic junction may provide enhanced magnetoresistance and/or enhanced spin transfer torque.

Figure 10:
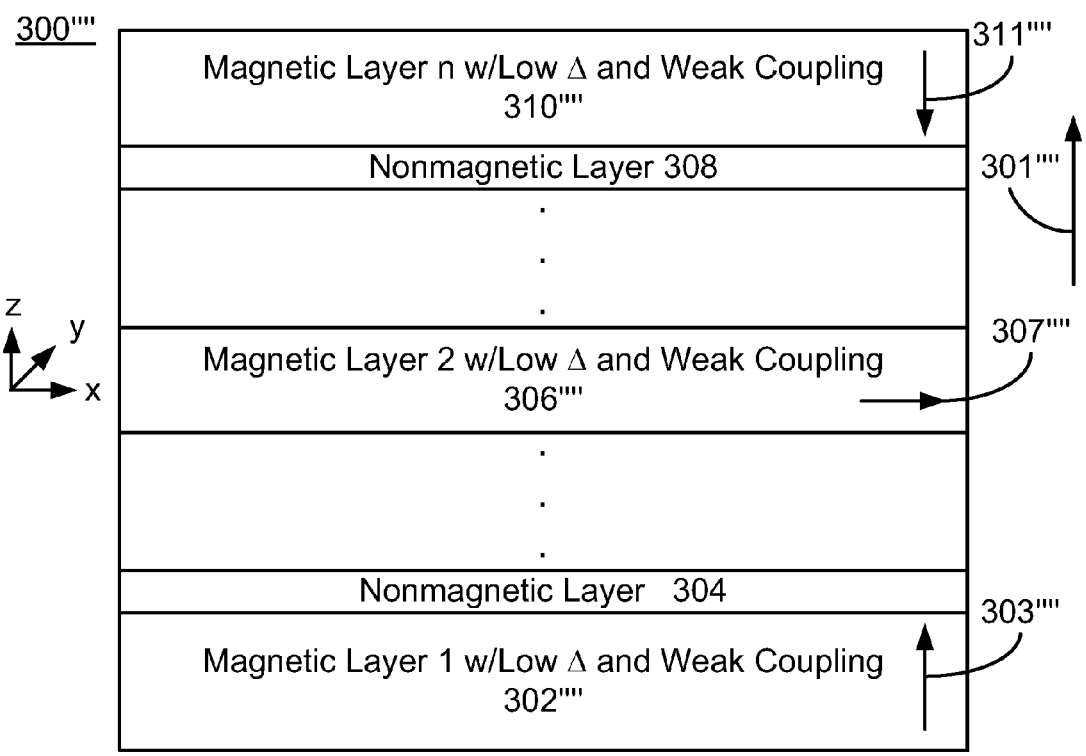
FIG. 10 depicts another exemplary embodiment of a free layer having a low magnetic thermal stability, ferromagnetic coupling and switchable using spin transfer.

FIG. 10 depicts another exemplary embodiment of a free layer 300'''' having subregions with a low magnetic thermal stability constant as well as magnetic coupling between the subregions and that are switchable using spin transfer. For clarity, FIG. 10 is not to scale. The free layer 300'''' may be usable in one or more of the magnetic junctions 200, 200' and/or 200". Thus, the free layer 300'''' may be used as one or more of the free layers 230, 230' and 230". The free layer 300'''' is also analogous to the free layers 300, 300', 300" and/or 300'''. Thus, analogous components have similar labels.

The free layer 300'''' thus includes magnetic layers 302'''', 306'''' and 310'''' that are interleaved with nonmagnetic layers 304 and 308, that have magnetic moments 303'''', 307'''' and 311'''' and that are analogous to layers 302/302'/302"/302''', 306/306'/306"/306''', 310/310'/310"/310''', 304 and 308, and to magnetic moments 303/303'/303"/303''', 307/307'/307"/307''' and 311/311'/311"/311''', respectively. The magnetic layers 302'''', 306'''' and 310'''' also correspond to the subregions of the layers 230, 230' and/or 230". Although three magnetic layers 302'''', 306'''' and 310'''' and two nonmagnetic layers 304 and 308 are shown, another number may be used.

Two or more magnetic layers may be present in different embodiments. In the embodiment shown, the total magnetic moment 301'''' of the free layer 300'''' may be substantially perpendicular to plane (i.e. in the z-direction). However, the magnetic moments 301'''', 303'''', 307'''' and 311'''' may be in other directions.

In some embodiments, the layer closest to the nonmagnetic spacer layer 220 is in the direction of the desired net magnetic moment 301'''' of the free layer 300''''. In such embodiments, the magnetoresistance may be enhanced. Thus, in the embodiment shown, the free layer 300'''' may be a free layer for a dual magnetic junction in a manner analogous to the layer 230''. However the same configuration may be used for other magnetic junctions. In addition, the free layer 300'''' has a magnetic domain therein. Stated differently, the free layer 300'''' has a vertical magnetic domain. As a result, the magnetic moment 303'''' of the bottom layer 302'''' is in the opposite direction from the top magnetic layer 310''''. In the embodiment shown, the magnetic moments 303'''' and 311'''' of the layers are perpendicular to plane. As a result, it is desirable in some embodiments for the magnetic moments 302'''' and 310'''' to differ. As a result, the free layer 300'''' has a net magnetic moment that has at least a component perpendicular to plane.

The free layer 300'''' may have similar benefits to the free layers 300, 300', 300'' and/or 300'''. In particular, the WER and write speed may be enhanced by the magnetic moments 303'''', 307'''' and 311'''' forming different angles with a direction perpendicular to the layers (e.g. the z direction). Further, a low thermal stability factor for individual subregions allows the free layer 300'''' to be thermally stable at and below the working temperatures while reducing the write current, WER and overdrive. Faster writing achieved. Thus, faster, less error prone switching may be achieved for the free layer 300''''. Further, use of a dual magnetic junction may provide enhanced magnetoresistance and/or enhanced spin transfer torque.

Figure 11:
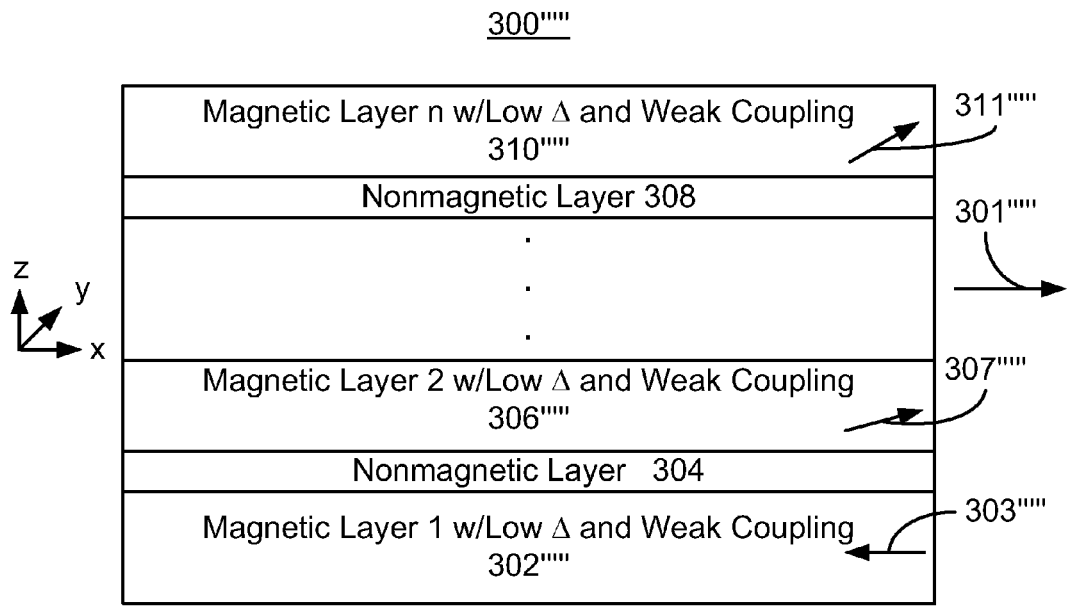
FIG. 11 depicts another exemplary embodiment of a free layer having a low magnetic thermal stability, ferromagnetic coupling and switchable using spin transfer.

FIG. 11 depicts another exemplary embodiment of a free layer 300''''' having subregions with a low magnetic thermal stability constant as well as magnetic coupling between the subregions and that are switchable using spin transfer. For clarity, FIG. 11 is not to scale. The free layer 300''''' may be usable in one or more of the magnetic junctions 200, 200' and/or 200''. Thus, the free layer 300''''' may be used as one or more of the free layers 230, 230' and 230''. The free layer 300''''' is also analogous to the free layers 300, 300', 300'', 300''' and/or 300''''. Thus, analogous components have similar labels.

The free layer 300''''' thus includes magnetic layers 302''''', 306''''' and 310''''' that are interleaved with nonmagnetic layers 304 and 308, that have magnetic moments 303''''', 307''''' and 311''''' and that are analogous to layers 302/302'/302''/302'''/302'''', 306/306'/306''/306'''/306'''', 310/310'/310''/310'''/310'''', 304 and 308, and to magnetic moments 303/303'/303''/303'''/303'''', 307/307'/307''/307'''/307'''' and 311/311'/311''/311'''/311'''', respectively. The magnetic layers 302''''', 306''''' and 310''''' also correspond to the subregions of the layers 230, 230' and/or 230''. Although three magnetic layers 302''''', 306''''' and 310''''' and two nonmagnetic layers 304 and 308 are shown, another number may be used. Two or more magnetic layers may be present in different embodiments. In the embodiment shown, the total magnetic moment 301''''' of the free layer 300''''' may be substantially in plane (e.g. in the x-direction as shown). However, the magnetic moments 301''''', 303''''', 307''''' and 311''''' may be in other directions.

The free layer 300''''' is shown as having a magnetic moment 301''''' substantially in plane. Thus, the layers 302''''', 306''''' and 310''''' have magnetic moments 303''''' 307''''' and 311''''', respectively, with some or all of their components in plane. In some embodiments, the layer closest to the nonmagnetic spacer layer 220 is in the direction of the desired net magnetic moment 301''''' of the free layer 300'''''. In such embodiments, the magnetoresistance may be enhanced. Thus, in the embodiment shown, the free layer 300''''' may be above the nonmagnetic spacer layer in a manner analogous to the layer 230. However the same configuration may be used for other magnetic junctions.

The free layer 300''''' may have similar benefits to the free layers 300, 300', 300'', 300''' and/or 300''''. In particular, the WER may be reduced and write speed may be enhanced by the magnetic moments 303''''', 307''''' and 311''''' forming different angles with a direction perpendicular to the layers (e.g. the z direction). Further, a low thermal stability factor for individual subregions allows the free layer 300''''' to be thermally stable at and below the working temperatures while reducing the write current, WER and overdrive. Faster writing achieved. Thus, faster, less error prone switching may be achieved for the free layer 300'''''. Further, use of a dual magnetic junction may provide enhanced magnetoresistance and/or enhanced spin transfer torque.

Figure 12:
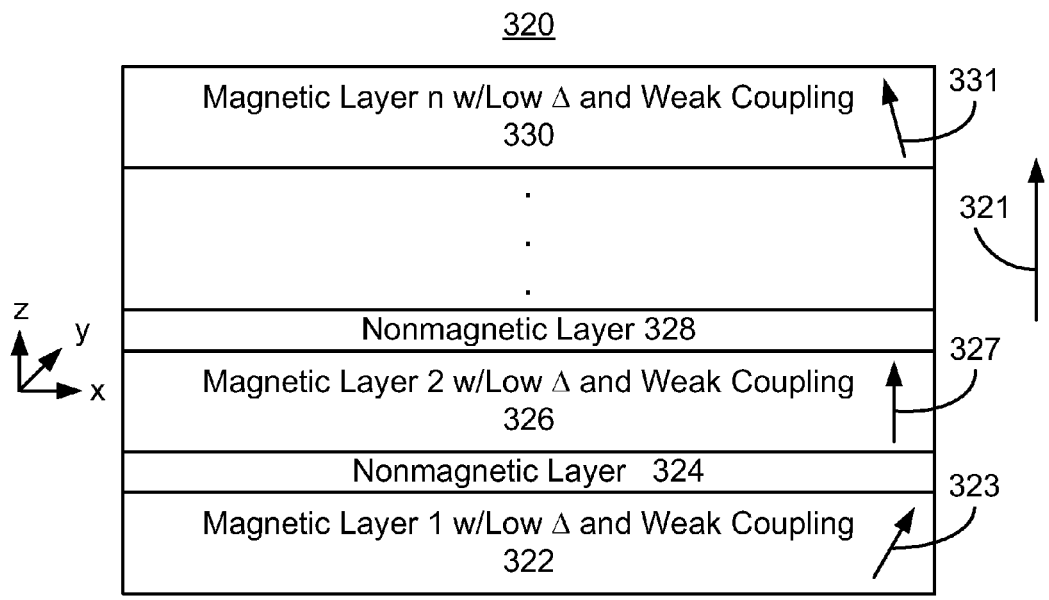
FIG. 12 depicts another exemplary embodiment of a free layer having a low magnetic thermal stability, ferromagnetic coupling and switchable using spin transfer.

FIG. 12 depicts an exemplary embodiment of a free layer 320 having subregions with a low magnetic thermal stability constant as well as magnetic coupling between the subregions and that are switchable using spin transfer. For clarity, FIG. 12 is not to scale. The free layer 320 may be usable in one or more of the magnetic junctions 200, 200' and/or 200''. Thus, the free layer 320 may be used as one or more of the free layers 230, 230' and 230''.

The free layer 320 includes magnetic layers 322, 326 and 330 interleaved with nonmagnetic layers 304 and 308. The magnetic layers 322, 326 and 330 correspond to the subregions of the layers 230, 230' and/or 230''. Although three magnetic layers 322, 326 and 330 and two nonmagnetic layers 324 and 328 are shown, another number may be used. For example, two or more magnetic layers may be present in different embodiments. The magnetic layers 322, 326 and 330 have magnetic moments 323, 327 and 331, respectively. In the embodiment shown, the total magnetic moment 321 of the free layer 320 may be substantially perpendicular to plane (i.e. in the z-direction in FIG. 12). Although depicted as being substantially perpendicular to plane, in other embodiments, the magnetic moments 321, 323, 327 and 331 may be in other directions.

In some embodiments, the magnetic layers 322, 326 and 330 each have a low magnetic thermal stability constant and a low thermal stability factor. In particular, a low thermal stability factor corresponds to a thermal stability factor of less than sixty at operating temperature(s) in some embodiments and/or less then forty at operating temperature(s) in other embodiments. There is also a weak magnetic coupling between the layers 322, 326 and 330. The weak magnetic coupling may be provided through the nonmagnetic layers 324 and 328. The presence of the nonmagnetic layers 324 and 328 allow the magnetic moments 323, 327 and 331 of the magnetic layers 322, 326 and 330, respectively, to differ somewhat. Although individual magnetic layers 322, 326 and 330 may not be thermally stable, the free layer 320 may have a stable net magnetic moment 321 in a particular direction.

The magnetic layers 322, 326 and through 330 are configured to be substantially identical. Thus, the magnitude of the moments and the direction of the easy axis may be substantially the same. In the embodiment shown, the easy axis for each of the layers 322, 326 and 330 is perpendicular to plane (in the z-direction). However, at any moment in time, the magnetic moments 303, 307 and 311 may be oriented at different angles with the normal to the plane of the layers. FIG. 12 may thus be considered to capture the free layer 320 at a moment in time. At another time, the magnetic moments 323, 327 and 331 may have another orientation.

Because the magnetic moments 323, 327 and 331 may form different angles with a direction perpendicular to the layers (e.g. the z direction), the switching characteristics of a magnetic junction using the free layer 320 may be improved. When a write current is applied, at least some of the magnetic moments 323, 327 and/or 331 are not aligned with the z-direction because of their thermal instability. One or more of the corresponding layers 322, 326 and/or 330 may not be along a stagnation point. Thus, the spin transfer torque may more readily switch these layers. The layers 322, 326 and through 330 of the free layer 320 may switch at different currents and/or times in a manner analogous to the layers of the free layer 110. However, the order in which the layers 322, 326 and through 330 of the free layer 320 switch is not constrained in the same manner as the layers of the free layer 110. For example, the layers 322, 326 and through 330 of the free layer 320 need not have a switching current density/thermal stability that increases in a direction away from the nonmagnetic spacer layer 220. The layers 322, 326 and through 330 of the free layer 320 may switch in a random order, or in an order that excludes switching in order from subregion closest to the nonmagnetic spacer layer 220 to furthest from the nonmagnetic spacer layer 220.

The WER and long tail in switching the free layer 320 may thus be reduced. The low thermal stability factor for individual subregions/layers 322, 326 and 330 in combination with the weak magnetic coupling between subregions/layers 322, 326 and 330 allow the free layer 320 to be thermally stable at and below the working temperatures while reducing the write current, WER and overdrive. Faster writing is achieved. Thus, faster, less error prone switching may be achieved for the free layer 320.

Figure 13:
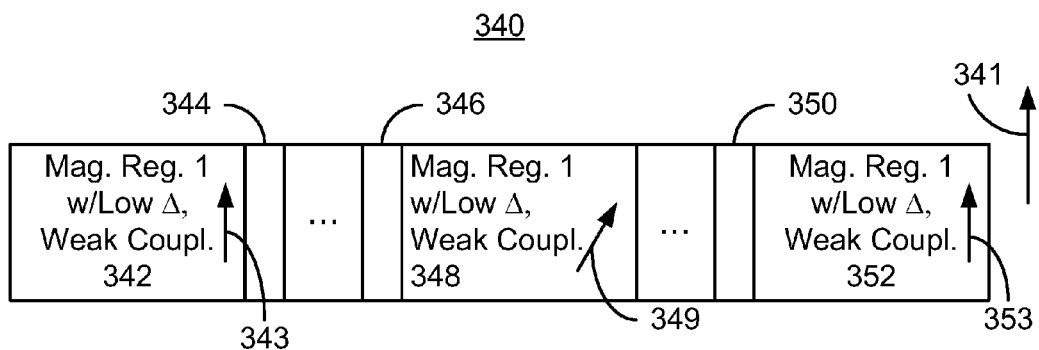
FIGS. 13-14 depict another exemplary embodiment of a free layer having a low magnetic thermal stability, ferromagnetic coupling and switchable using spin transfer.

FIG. 13 depicts an exemplary embodiment of a free layer 340 having subregions with a low magnetic thermal stability constant as well as magnetic coupling between the subregions and that are switchable using spin transfer. For clarity, FIG. 13 is not to scale. The free layer 340 may be usable in one or more of the magnetic junctions 200, 200' and/or 200". Thus, the free layer 340 may be used as one or more of the free layers 230, 230' and 230".

The free layer 340 is a single magnetic layer including magnetic subregions 342, 348 and 352 separated by intervening regions 344, 346 and 350. Although three magnetic subregions 342, 348 and 352 and intervening three regions 344, 346 and 350 are shown, in another embodiment another number of magnetic subregions and another number of intervening regions may be used. In the embodiment shown, the total magnetic moment 341 of the free layer 340 may be substantially perpendicular to plane. In other embodiments, the magnetic moments 341, 343, 349 and 353 may be in other directions. In other embodiments, multiple layers each having magnetic subregions analogous to the regions 342, 348 and 352 may be used in the free layer.

The magnetic subregions 342, 348 and 352 each have a low magnetic thermal stability constant and a low thermal stability factor. In particular, a low thermal stability factor corresponds to a thermal stability factor of less than sixty at operating temperature(s) in some embodiments and/or less then forty at operating temperature(s) in other embodiments. There is also a weak magnetic coupling between the subregions 342, 348 and 352. The weak magnetic coupling may be provided through the intervening regions 344, 346 and 350. The presence of the intervening regions 344, 346 and 350 allow the magnetic moments 343, 349 and 353 of the magnetic subregions 342, 348 and 352, respectively, to differ somewhat. Although individual magnetic subregions 342, 348 and 352 may not be thermally stable, the free layer 340 may have a stable net magnetic moment 341 in a particular direction. Stated differently, the easy axes of the subregions 342, 348 and 352 may be in substantially the same direction. The magnitudes of the moments 343, 349 and 353 may be the same or different. In the embodiment shown, the easy axis for each of the subregions 342, 348 and 352 is perpendicular to plane (in the z-direction). However, the magnetic moments 343, 349 and 353 may be oriented at different angles with the normal to the plane of the layers. In some embodiments, the subregions 342, 348 and 352 are configured to be substantially the same. In such embodiments, thermal fluctuations may be responsible for the differences in the directions of the magnetic moments 343, 349 and 353. In other embodiments, the subregions 342, 348 and 352 may be different. In such embodiments, the differences in directions of the magnetic moments 343, 349 and 353 may be part of configuring the subregions 342, 348 and 352 and/or may be due to thermal fluctuations in the moments 343, 349 and 353.

Because the magnetic moments 343, 349 and 353 may form different angles with a direction perpendicular to the layers (e.g. the easy axis/direction of moment 341), the switching characteristics of a magnetic junction using the free layer 340 may be improved. When a write current is applied, at least some of the magnetic moments 343, 349 and/or 353 are not aligned with the z-direction. One or more of the corresponding regions 342, 348 and/or 352 may not be along a stagnation point. Thus, the spin transfer torque may more readily switch these regions. The magnetic coupling between the subregions 342, 348 and 352 and/or the spin transfer torque may switch the remaining subregions. Thus, the subregions 342, 348 and through 352 of the free layer 340 may switch at different currents and/or times in a manner analogous to the layers of the free layer 110. However, the order in which the subregions 342, 348 and through 352 of the free layer 340 switch is not constrained in the same manner as the layers of the free layer 110. The subregions 342, 348 and through 352 of the free layer 340 may switch in a random order, or in an order that excludes switching in order from subregion closest to the nonmagnetic spacer layer 220 to furthest from the nonmagnetic spacer layer 220.

Figure 14:
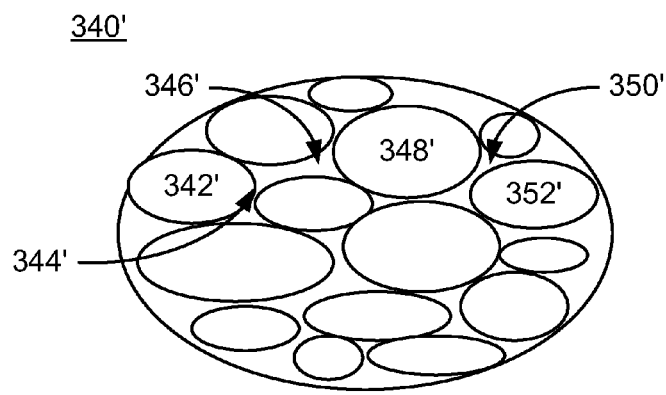
Figure 15:
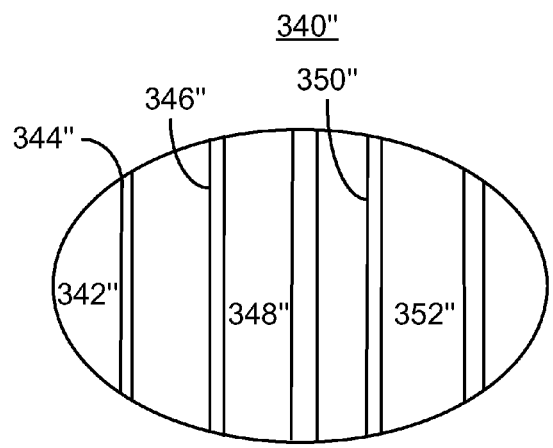
FIG. 15 depicts another exemplary embodiment of a free layer having a low magnetic thermal stability, ferromagnetic coupling and switchable using spin transfer.
Figure 16:
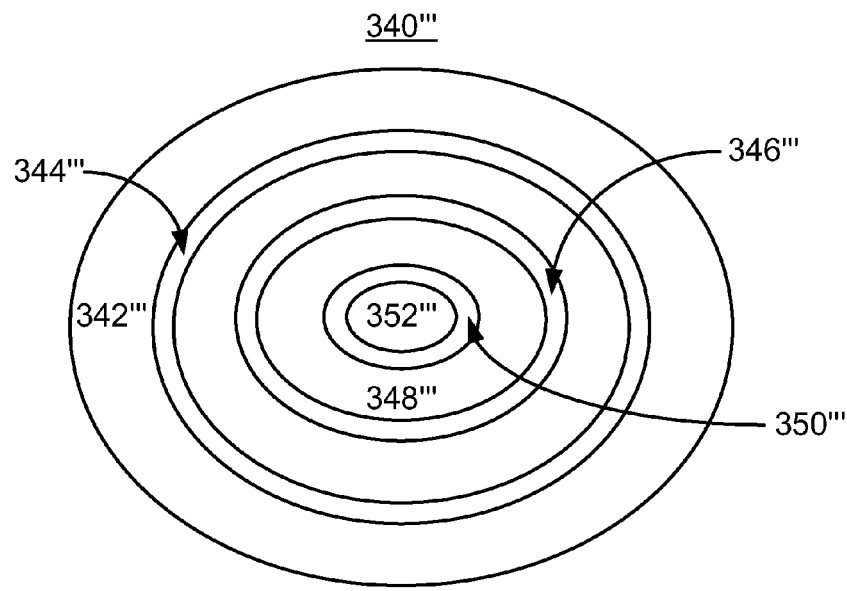
FIG. 16 depicts another exemplary embodiment of a free layer having a low magnetic thermal stability, ferromagnetic coupling and switchable using spin transfer.

The magnetic subregions 342, 348 and through 352 in the single layer of the free layer 340 may be configured in a number of ways. In some embodiments, the magnetic subregions are grains. One such embodiment is depicted in FIG. 14. FIG. 14 depicts a plan view of a free layer 340' including grains 342', 348' and 352' that are analogous to the free layer 340 and subregions 342, 348 and 352, respectively. The free layer 340' includes magnetic grains 342', 348' and 352' separated by grain boundaries 344', 346' and 350'. Alternatively, the regions 342', 348' and 352' may be magnetic regions/particles separated by grain boundaries or portions of a nonmagnetic matrix. In other embodiments, the magnetic subregions 342', 348' and 352' may be formed in another manner. FIG. 15 depicts a plan view of a free layer 340" including regions 342", 348" and 352" that are analogous to the free layer 340/340' and subregions 342/342', 348/348' and 352/352', respectively. The subregions 342", 348" and 352" may be formed photolithographically or in an analogous manner. These regions 342", 348" and 352" may be separated by photolithographically formed nonmagnetic regions 344", 346" and 350" and/or grain boundaries. FIG. 16 depicts a plan view of a free layer 340''' including regions 342''', 348''' and 352''' that are analogous to the free layer 340/340'/340" and subregions 342/342'/342", 348/348'/348" and 352/352'/352", respectively. The subregions 342''', 348''' and 352''' may be formed photolithographically or in an analogous manner. These regions 342''', 348''' and 352''' may be separated by photolithographically formed nonmagnetic subregions 344''', 346''' and 350''' and/or grain boundaries. In contrast to the free layer 340", however, the subregions 342''' and 348''' surround other magnetic subregions, with the magnetic subregion 352''' being within the remaining subregions.

The WER and long tail in switching the free layers 340, 340', 340" and/or 340''' may thus be reduced. The low thermal stability factor for individual subregions 342, 348 and 352 in combination with the weak magnetic coupling between subregions 342, 348 and 352 allow the free layer 340 to be thermally stable at and below the working temperatures while reducing the write current, WER and overdrive. Faster writing is achieved. Thus, faster, less error prone switching may be achieved for the free layer 340, 340', 340", and/or 340'''.

Figure 17:
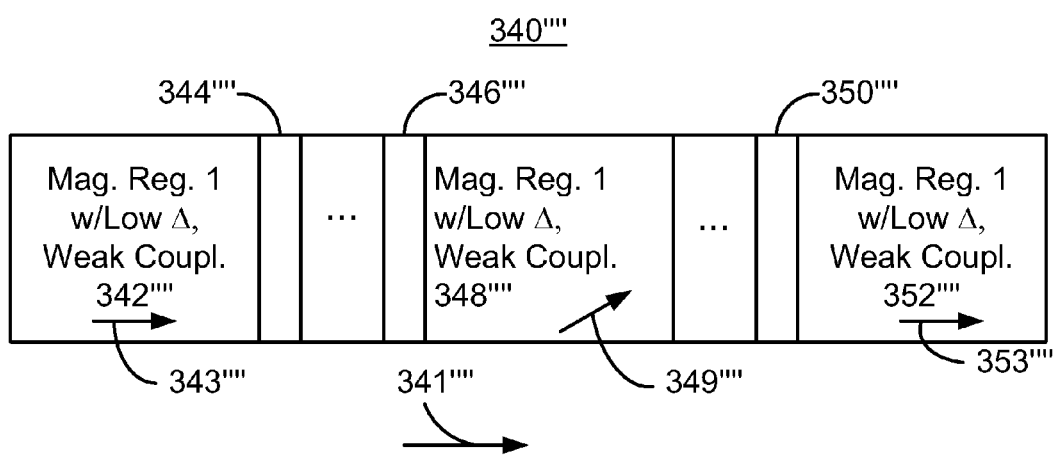
FIG. 17 depicts another exemplary embodiment of a free layer having a low magnetic thermal stability, ferromagnetic coupling and switchable using spin transfer.

FIG. 17 depicts another exemplary embodiment of a free layer 340'''' having subregions with a low magnetic thermal stability constant as well as magnetic coupling between the subregions and that are switchable using spin transfer. For clarity, FIG. 17 is not to scale. The free layer 340'''' may be usable in one or more of the magnetic junctions 200, 200' and/or 200". Thus, the free layer 340'''' may be used as one or more of the free layers 230, 230' and 230". The free layer 340'''' is also analogous to the free layers 340, 340', 340" and/or 340'''. Thus, analogous components have similar labels.

The free layer 340'''' thus includes magnetic subregions 342'''', 348'''' and 352'''' with interleaving regions 344'''' and 346'''' and 350'''', that have magnetic moments 343'''', 349'''' and 353'''' and that are analogous to layers 342/342'/342"/342''', 348/348'/348"/348''', 352/352'/352"/352''', 344/344'/344"/344''', 346/346'/346"/346''' and 350/350'/350"/350''', and to magnetic moments 343/343'/343"/343''', 349/349'/349"/349''' and 353/353'/353"/353''', respectively. The magnetic subregions 342'''', 348'''' and 352'''' also correspond to the subregions of the layers 230, 230' and/or 230". Although three magnetic subregions 342'''', 348'''' and 352'''' are shown, another number may be present. In the embodiment shown, the total magnetic moment 341'''' of the free layer 340'''' may be substantially in plane (e.g. in the direction of moment 341''''). However, the magnetic moments 341'''', 343'''', 349'''' and 353'''' may be in other directions.

The free layer 340'''' may have similar benefits to the free layers 340, 340', 340" and/or 340'''. In particular, the WER may be reduced and write speed may be enhanced by the magnetic moments 343'''', 349'''' and 353'''' forming different angles with the direction of the easy axis (e.g. the direction of moment 341''''). Further, a low thermal stability factor for individual subregions allows the free layer 340'''' to be thermally stable at and below the working temperatures while reducing the write current, WER and overdrive. Faster writing achieved. Thus, faster, less error prone switching may be achieved for the free layer 340''''.

Figure 18:
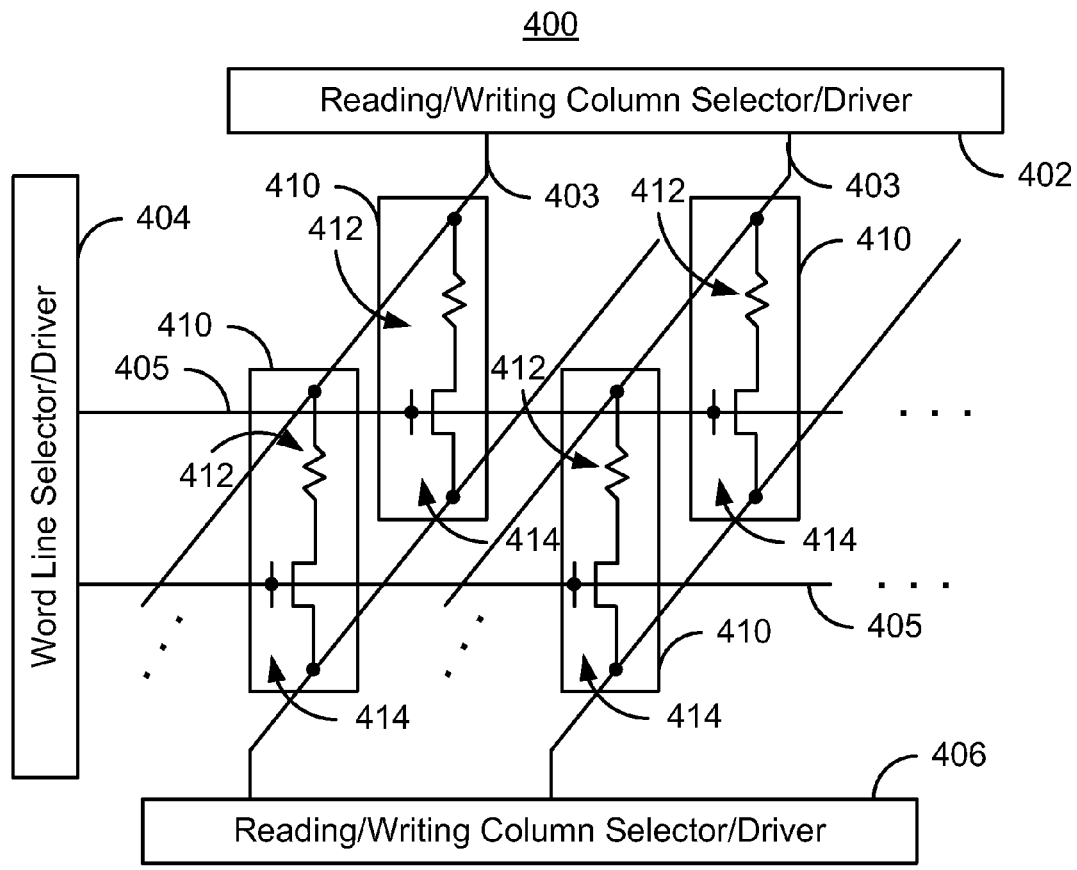
FIG. 18 depicts an exemplary embodiment of a memory utilizing magnetic junctions in the memory element(s) of the storage cell(s).

Further, the magnetic junctions 200, 200' and/or 200" and free layers 230, 230', 230", 300, 300', 300", 300''', 300'''', 300''''', 320, 340, 340', 340", 340''' and/or 340'''' may be used in a magnetic memory. FIG. 18 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may include one or more of the magnetic junctions 200, 200' and/or 200" and free layers 230, 230', 230", 300, 300', 300", 300''', 300'''', 300''''', 320, 340, 340', 340", 340''' and/or 340''''. Although one magnetic junction 412 is shown per cell 410, in other embodiments, another number of magnetic junctions 412 may be provided per cell.

Because the magnetic memory 400 utilizes the magnetic junctions 200, 200' and/or 200" and free layers 230, 230', 230", 300, 300', 300", 300''', 300'''', 300''''', 320, 340, 340', 340", 340''' and/or 340'''', performance may be improved. In particular, a lower switching current may be used while maintaining thermal stability of the memory 400.

Figure 19:
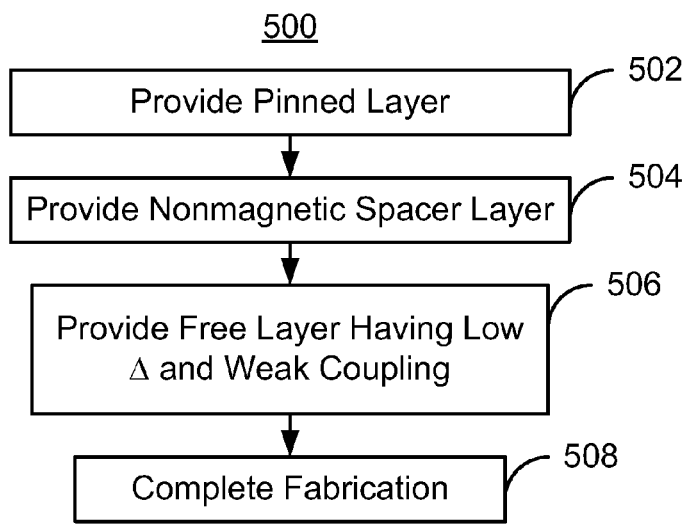
FIG. 19 an exemplary embodiment of a method for fabricating a magnetic junction including a free layer having a low magnetic thermal stability, ferromagnetic coupling and switchable using spin transfer.

FIG. 19 depicts an exemplary embodiment of a method 500 for fabricating magnetic junction, such as the magnetic junctions 200, 200', and/or 200" using free layer(s) 230, 230', 230", 300, 300', 300", 300''', 300'''', 300''''', 320, 340, 340', 340", 340''' and/or 340''''. For simplicity, some steps may be omitted, combined, performed in another order, and/or interleaved. The method 500 is described in the context of the magnetic junction 200. However, the method 200 may be used on other magnetic junctions such as the junctions 200, 200', and/or 200" using free layer(s) 230, 230', 230", 300, 300', 300", 300''', 300'''', 300''''', 320, 340, 340', 340", 340''' and/or 340''''. Further, the method 500 may be incorporated into fabrication of magnetic memories. Thus the method 500 may be used in manufacturing a STT-MRAM 400 or other magnetic memory. The method 500 may also include providing optional seed layer(s), optional capping layer(s) and optional pinning layer (not shown).

The pinned layer 210 is provided, via step 502. Step 502 may include depositing the desired materials at the desired thickness of the pinned layer 210. Further, step 502 may include providing a SAF.

The nonmagnetic layer 220 is provided, via step 504. Step 504 may include depositing the desired nonmagnetic materials, including but not limited to crystalline MgO. In addition, the desired thickness of material may be deposited in step 504.

The free layer 230 is provided, via step 506. Step 506 may include depositing the desired materials at the desired thickness of the free layer 110. More specifically, the free layer provided has the desired lower magnetic thermal stability and weak ferromagnetic coupling. In step 506, the layers 230, 230', 230", 300, 300', 300", 300''', 300'''', 300''''', 320, 340, 340', 340", 340''' and/or 340'''' are fabricated.

Fabrication is completed, via step 508. In some embodiments, step 508 includes fabricating an additional spacer layer such as the layer 240 and an additional pinned layer such as the layer 250. Optional capping and/or other layers may also be deposited in step 508. Thus, using the method 500, the benefits of the magnetic junctions 200, 200' and/or 200" and free layers 230, 230', 230", 300, 300', 300", 300''', 300'''', 300''''', 320, 340, 340', 340", 340''' and/or 340'''' may be achieved.

A method and system for providing an easy to switch free layer, a magnetic junction using such a free layer and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a pinned layer;
   a nonmagnetic spacer layer; and
   a free layer having a plurality of subregions, each of the plurality of subregions having a magnetic thermal stability constant, the plurality of subregions being ferromagnetically coupled such that the free layer has a total magnetic thermal stability constant; the magnetic thermal stability constant being such that the each of the plurality of subregions is magnetically thermally unstable at an operating temperature, the total magnetic thermal stability constant being such that the free layer is magnetically thermally stable at the operating temperature;
   wherein the magnetic junction is configured such that the free layer is switchable between a plurality of stable magnetic states when a write current is passed through the magnetic junction.

2. The magnetic junction of claim 1 wherein the plurality of subregions includes a plurality of magnetic layers interleaved with at least one nonmagnetic layer.

3. The magnetic junction of claim 2 wherein the plurality of magnetic layers has a first layer an a second layer, the first layer having a first layer magnetization and being closest to the nonmagnetic spacer layer and a second layer having a second layer magnetization and being furthest from the nonmagnetic spacer layer, the first layer magnetization being substantially perpendicular to plane.

4. The magnetic junction of claim 3 wherein the second layer has a second layer magnetization substantially antiparallel to the first layer magnetization, the first layer magnetization having a first magnitude different from a second magnitude of the second layer magnetization.

5. The magnetic junction of claim 3 wherein the free layer has a domain wall therein.

6. The magnetic junction of claim 3 wherein the first layer magnetization is substantially parallel to the second layer magnetization.

7. The magnetic junction of claim 2 wherein the plurality of magnetic layers are substantially identical.

8. The magnetic junction of claim 1 wherein the plurality of subregions correspond to a plurality of grains separated by at least one grain boundary.

9. The magnetic junction of claim 1 wherein the thermal stability constant of each of the plurality of subregions is not more than a quantity, the quantity being eighty multiplied by $k_b$ multiplied by the operating temperature.

10. The magnetic junction of claim 9 wherein the quantity is not more than forty multiplied by the $k_b$ multiplied by the operating temperature.

11. The magnetic junction of claim 1 wherein the plurality of subregions are configured to switch in an order independent of distance from the nonmagnetic spacer layer.

12. A magnetic memory comprising:
    a plurality of magnetic storage cells, each of the plurality of magnetic storage cells including at least one magnetic junction, the at least one magnetic junction includes a pinned layer, a nonmagnetic spacer layer and a free layer having a plurality of subregions, each of the plurality of subregions having a magnetic thermal stability constant, the plurality of subregions being ferromagnetically coupled such that the free layer has a total magnetic thermal stability constant; the magnetic thermal stability constant being such that the each of the plurality of subregions is magnetically thermally unstable at an operating temperature, the total magnetic thermal stability constant being such that the free layer is magnetically thermally stable at the operating temperature, the magnetic junction being configured such that the free layer is switchable between a plurality of stable magnetic states when a write current is passed through the magnetic junction; and
    a plurality of bit lines coupled with the plurality of magnetic storage cells.

13. The magnetic memory of claim 12 wherein the plurality of subregions includes a plurality of magnetic layers interleaved with at least one nonmagnetic layer.

14. The magnetic memory of claim 13 wherein the plurality of magnetic layers has a first layer an a second layer, the first layer having a first layer magnetization and being closest to the nonmagnetic spacer layer and a second layer having a second layer magnetization and being furthest from the nonmagnetic spacer layer, the first layer magnetization being substantially perpendicular to plane.

15. The magnetic memory of claim 14 wherein the second layer has a second layer magnetization substantially antiparallel to the first layer magnetization, the first layer magnetization having a first magnitude different from a second magnitude of the second layer magnetization.

16. The magnetic memory of claim 14 wherein the free layer has a domain wall therein.

17. The magnetic memory of claim 12 wherein the plurality of subregions correspond to a plurality of grains separated by at least one grain boundary.

18. The magnetic memory of claim 12 wherein the each of the plurality of subregions has a thermal stability constant of not more than eighty.

19. The magnetic junction of claim 12 wherein the plurality of subregions are configured to switch in an order independent of distance from the nonmagnetic spacer layer.

20. A method for providing a magnetic junction for use in a magnetic device comprising:
    providing a pinned layer;
    providing a nonmagnetic spacer layer; and
    providing a free layer having a plurality of subregions, each of the plurality of subregions having a magnetic thermal stability constant, the plurality of subregions being ferromagnetically coupled such that the free layer has a total magnetic thermal stability constant; the magnetic thermal stability constant being such that the each of the plurality of subregions is magnetically thermally unstable at an operating temperature, the total magnetic thermal stability constant being such that the free layer is magnetically thermally stable at the operating temperature;
    wherein the magnetic junction is configured such that the free layer is switchable between a plurality of stable magnetic states when a write current is passed through the magnetic junction.

* * * * *